United States Patent
Matsuura et al.

(10) Patent No.: US 10,833,673 B2
(45) Date of Patent: Nov. 10, 2020

(54) SEMICONDUCTOR DEVICE

(71) Applicants: MITSUBISHI HEAVY INDUSTRIES, LTD., Tokyo (JP); JAPAN AEROSPACE EXPLORATION AGENCY, Tokyo (JP)

(72) Inventors: Daisuke Matsuura, Tokyo (JP); Takanori Narita, Tokyo (JP); Masahiro Kato, Tokyo (JP); Daisuke Kobayashi, Kanagawa (JP); Kazuyuki Hirose, Kanagawa (JP); Osamu Kawasaki, Ibaraki (JP); Yuya Kakehashi, Kanagawa (JP); Taichi Ito, Kanagawa (JP)

(73) Assignees: MITSUBISHI HEAVY INDUSTRIES, LTD., Tokyo (JP); JAPAN AEROSPACE EXPLORATION AGENCY, Tokyo (JP)

(*) Notice: Subject to any disclaimer, the term of this patent is extended or adjusted under 35 U.S.C. 154(b) by 0 days.

(21) Appl. No.: 16/490,233

(22) PCT Filed: Feb. 7, 2018

(86) PCT No.: PCT/JP2018/004212
§ 371 (c)(1),
(2) Date: Aug. 30, 2019

(87) PCT Pub. No.: WO2018/163696
PCT Pub. Date: Sep. 13, 2018

(65) Prior Publication Data
US 2020/0007124 A1    Jan. 2, 2020

(30) Foreign Application Priority Data
Mar. 10, 2017 (JP) .................. 2017-046514

(51) Int. Cl.
H03K 17/687 (2006.01)
H01L 21/8238 (2006.01)
H01L 27/092 (2006.01)

(52) U.S. Cl.
CPC ..... H03K 17/6872 (2013.01); H01L 21/8238 (2013.01); H01L 27/0928 (2013.01)

(58) Field of Classification Search
CPC ............ H03K 17/6872; H01L 21/8238; H01L 27/0928; H01L 27/1203; H01L 21/84;
(Continued)

(56) References Cited

U.S. PATENT DOCUMENTS 5,103,277 A    4/1992  Caviglia et al.
5,359,219 A   10/1994  Hwang
(Continued)

FOREIGN PATENT DOCUMENTS

JP    03-119764    5/1991
JP    2002-164544   6/2002
(Continued)

OTHER PUBLICATIONS

International Search Report dated Apr. 17, 2018 in International (PCT) Application No. PCT/JP2018/004212.
(Continued)

*Primary Examiner* — Metasebia T Retebo
(74) *Attorney, Agent, or Firm* — Wenderoth, Lind & Ponack, L.L.P.

(57) ABSTRACT

An operation adjustment method of an SOI device comprises steps of: (a) obtaining a drain current-substrate bias voltage characteristic of an NMOS transistor for a source-gate voltage of 0V; (b) obtaining a lowest substrate bias voltage which turns on the NMOS transistor from the drain current-substrate bias voltage characteristic; (c) determining an upper limit of a substrate bias voltage of a PMOS
(Continued)

transistor as a voltage obtained by subtracting a built-in potential of a pn junction from the lowest substrate bias voltage; and (d) determining the substrate bias voltage of the PMOS transistor as a positive voltage lower than the upper limit. Reduction in the power consumption and maintenance of the radiation tolerance are both achieved for the SOI device.

13 Claims, 8 Drawing Sheets

(58) Field of Classification Search
CPC . H01L 29/78648; H01L 27/08; H01L 27/088; H01L 27/092
USPC .......................................................... 327/437
See application file for complete search history.

(56) References Cited

U.S. PATENT DOCUMENTS

| | | | |
|---|---|---|---|
| 2003/0001658 A1 | 1/2003 | Matsumoto | |
| 2003/0113980 A1* | 6/2003 | Babcock | H01L 21/84 438/424 |
| 2009/0057746 A1 | 3/2009 | Sugll et al. | |
| 2012/0313172 A1 | 12/2012 | Matsudaira et al. | |
| 2014/0051222 A1 | 2/2014 | Terahara et al. | |
| 2016/0180923 A1* | 6/2016 | Kamohara | H04B 1/385 365/156 |
| 2018/0005685 A1* | 1/2018 | Hasegawa | G11C 7/222 |

FOREIGN PATENT DOCUMENTS

| | | |
|---|---|---|
| JP | 2002-314041 | 10/2002 |
| JP | 2004-006870 | 1/2004 |
| JP | 2011-009567 | 1/2011 |
| JP | 2012-256649 | 12/2012 |
| JP | 2013-093371 | 5/2013 |
| JP | 2014-038952 | 2/2014 |
| WO | 99/33115 | 7/1999 |

OTHER PUBLICATIONS

International Preliminary Report on Patentability dated Sep. 10, 2019 in corresponding International (PCT) Application No. PCT/JP2018/004212, with English translation.
Extended European Search Report dated Jan. 22, 2020 in corresponding European Patent Application No. 18763678.2.

* cited by examiner

SEMICONDUCTOR DEVICE

TECHNICAL FIELD

The present invention relates to a semiconductor device and an operation adjustment method thereof, more particularly, to control of a substrate bias voltage of a semiconductor device using a silicon-on-insulator (SOI) technology.

BACKGROUND ART

The SOI technology is widely used as a technology for improving the operation speed of a semiconductor device and reducing the power consumption. In a semiconductor device using an SOI technology (which may be simply referred to as "SOI device", hereinafter), a dielectric layer (buried dielectric layer) is formed under a channel of an MOS transistor, and this effectively reduces the parasitic capacitance of the MOS transistor. Accordingly, use of the SOI technology achieves rapid operation speed and reduced power consumption.

To further reduce power consumption, technologies to control substrate bias voltages of SOI devices have been studied. An approach to reduce power consumption through substrate bias voltage control is further effective especially with respect to an SOI device comprising a thin buried dielectric layer, in which the threshold voltages of MOS transistors can be controlled by a relatively low substrate bias voltage.

Meanwhile, the inventors have found that the substrate bias voltage may influence on radiation tolerance as a result of a study of SOI devices. According to the inventors' study, an inappropriate substrate bias voltage may cause a negative impact on the radiation tolerance. Accordingly, there is a technical need for achieving both reduction in power consumption and maintenance of radiation tolerance for SOI devices.

As for a technology related to the present invention, Japanese Patent Application Publication No. 2011-9567 discloses a technology for reducing soft errors. This publication discloses a technology for reducing soft errors in a semiconductor device using a triple-well configuration, in which a p-type conductive portion is connected to a P-well to thereby suppress an increase in the potential of the P-well when a neutron is made incident.

CITATION LIST

Patent Literature

[Patent Literature 1] JP 2011-9567 A

SUMMARY OF THE INVENTION

Accordingly, one objective of the present invention is to provide a technology for achieving both reduction in power consumption and maintenance of radiation tolerance for an SOI device.

Other objectives of the present invention would be understood by a person skilled in the art from the following disclosure.

Provided in one aspect of the present invention is an operation adjustment method for a semiconductor device comprising: a semiconductor substrate; a deep N-well formed in the semiconductor substrate; an N-well formed in the deep N-well; a P-well formed in the deep N-well; semiconductor layer formed in a surface portion of the semiconductor substrate; and a buried dielectric layer formed between the semiconductor layer and the deep N-well to electrically isolate the semiconductor layer and the deep N-well, wherein a pn junction is formed between the N-well and the P-well, a PMOS transistor is formed in the semiconductor layer at a position opposing to the N-well, and an NMOS transistor is formed in the semiconductor layer at a position opposing to the P-well. The operation adjustment method comprises steps of: (a) obtaining a drain current-substrate bias voltage characteristic of the NMOS transistor for a source-gate voltage of 0V; (b) obtaining a lowest substrate bias voltage which turns on the NMOS transistor from the drain current-substrate bias voltage characteristic; (c) determining an upper limit of a substrate bias voltage of the PMOS transistor as a voltage obtained by subtracting a built-in potential of the pn junction from the lowest substrate bias voltage; and (d) determining the substrate bias voltage of the PMOS transistor as a positive voltage lower than the upper limit.

When the semiconductor substrate comprises a silicon substrate, it is preferable that, in the (d) step, the substrate bias voltage of the PMOS transistor is determined as being higher than a voltage obtained by subtracting 1.2V from the lowest substrate bias voltage and lower than a voltage obtained by subtracting 0.7V from the lowest substrate bias voltage. More preferably, the substrate bias voltage of the PMOS transistor is determined as being higher than a voltage obtained by subtracting 1.0V from the lowest substrate bias voltage.

Provided in another aspect of the present invention is an operation adjustment method for a semiconductor device comprising: a semiconductor substrate; a deep P-well formed in the semiconductor substrate; an N-well formed in the deep P-well; a P-well formed in the deep P-well; a semiconductor layer formed in a surface portion of the semiconductor substrate; and a buried dielectric layer formed between the semiconductor layer and the deep P-well to electrically isolate the semiconductor layer and the deep P-well, wherein a pn junction is formed between the N-well and the P-well, a PMOS transistor is formed in the semiconductor layer at a position opposing to the N-well, and an NMOS transistor being formed in the semiconductor layer at a position opposing to the P-well. The operation adjustment method comprises steps of: (a) obtaining a drain current-substrate bias voltage characteristic of the PMOS transistor for a source-gate voltage of 0V; (b) obtaining a highest substrate bias voltage which turns on the PMOS transistor from the drain current-substrate bias voltage characteristic; (c) determining a lower limit of a substrate bias voltage of the NMOS transistor as a voltage obtained by adding a built-in potential of the pn junction to the highest substrate bias voltage; and (d) determining the substrate bias voltage of the NMOS transistor as a negative voltage higher than the lower limit.

When the semiconductor substrate comprises a silicon substrate, it is preferable that, in the (d) step, the substrate bias voltage of the NMOS transistor is determined as being higher than a voltage obtained by adding 0.7V to the highest substrate bias voltage and lower than a voltage obtained by adding 1.2V to the highest substrate bias voltage. It is more preferable that the substrate bias voltage of the NMOS transistor is determined as being lower than a voltage obtained by adding 1.0V to the highest substrate bias voltage.

In still another aspect of the present invention, a semiconductor device comprises: a semiconductor substrate; a deep N-well formed in the semiconductor substrate; an N-well formed in the deep N-well; a P-well formed in the deep N-well; a semiconductor layer formed in a surface portion of the semiconductor substrate; and a buried dielectric layer formed between the semiconductor layer and the deep N-well to electrically isolate the semiconductor layer from the deep N-well. A pn junction is formed between the N-well and the P-well. A PMOS transistor is formed in the semiconductor layer at a position opposing to the N-well, and an NMOS transistor is formed in the semiconductor layer at a position opposing to the P-well. A substrate bias voltage of the PMOS transistor is set to a first voltage when the semiconductor device is placed in a first mode. The substrate bias voltage of the PMOS transistor is set to a second voltage higher than the first voltage when the semiconductor device is placed in a second mode. The second voltage is a positive voltage lower than a voltage obtained by subtracting a built-in potential of the pn junction from a lowest substrate bias voltage which turns on the NMOS transistor when a source-gate voltage thereof is 0V.

When the semiconductor substrate comprises a silicon substrate, the second voltage is preferably higher than a voltage obtained by subtracting 1.2V from the lowest substrate bias voltage and lower than a voltage obtained by subtracting 0.7V from the lowest substrate bias voltage. More preferably, the second voltage is higher than a voltage obtained by subtracting 1.0V from the lowest substrate bias voltage.

In still another aspect of the present invention, a semiconductor device comprises: a semiconductor substrate; a deep P-well formed in the semiconductor substrate; an N-well formed in the deep P-well; a P-well formed in the deep P-well; a semiconductor layer formed in a surface portion of the semiconductor substrate; and a buried dielectric layer formed between the semiconductor layer and the deep P-well to electrically isolate the semiconductor layer from the deep P-well. A pn junction is formed between the N-well and the P-well. A PMOS transistor is formed in the semiconductor layer at a position opposing to the N-well, and an NMOS transistor is formed in the semiconductor layer at a position opposing to the P-well. A substrate bias voltage of the NMOS transistor is set to a first voltage when the semiconductor device is placed in a first mode. The substrate bias voltage of the NMOS transistor is set to a second voltage lower than the first voltage when the semiconductor device is placed in a second mode. The second voltage is a negative voltage higher than a voltage obtained by adding a built-in potential of the pn junction to a highest substrate bias voltage which turns on the PMOS transistor when a source-gate voltage thereof is 0V.

When the semiconductor substrate comprises a silicon substrate, the second voltage is preferably higher than a voltage obtained by adding 0.7V to the highest substrate bias voltage and lower than a voltage obtained by adding 1.2V to the highest substrate bias voltage. More preferably, the second voltage is lower than a voltage obtained by adding 1.0V to the highest substrate bias voltage.

The present invention provides a technology for achieving both reduction in power consumption and maintenance of radiation tolerance for an SOI device.

DESCRIPTION OF EMBODIMENTS

Figure 1:
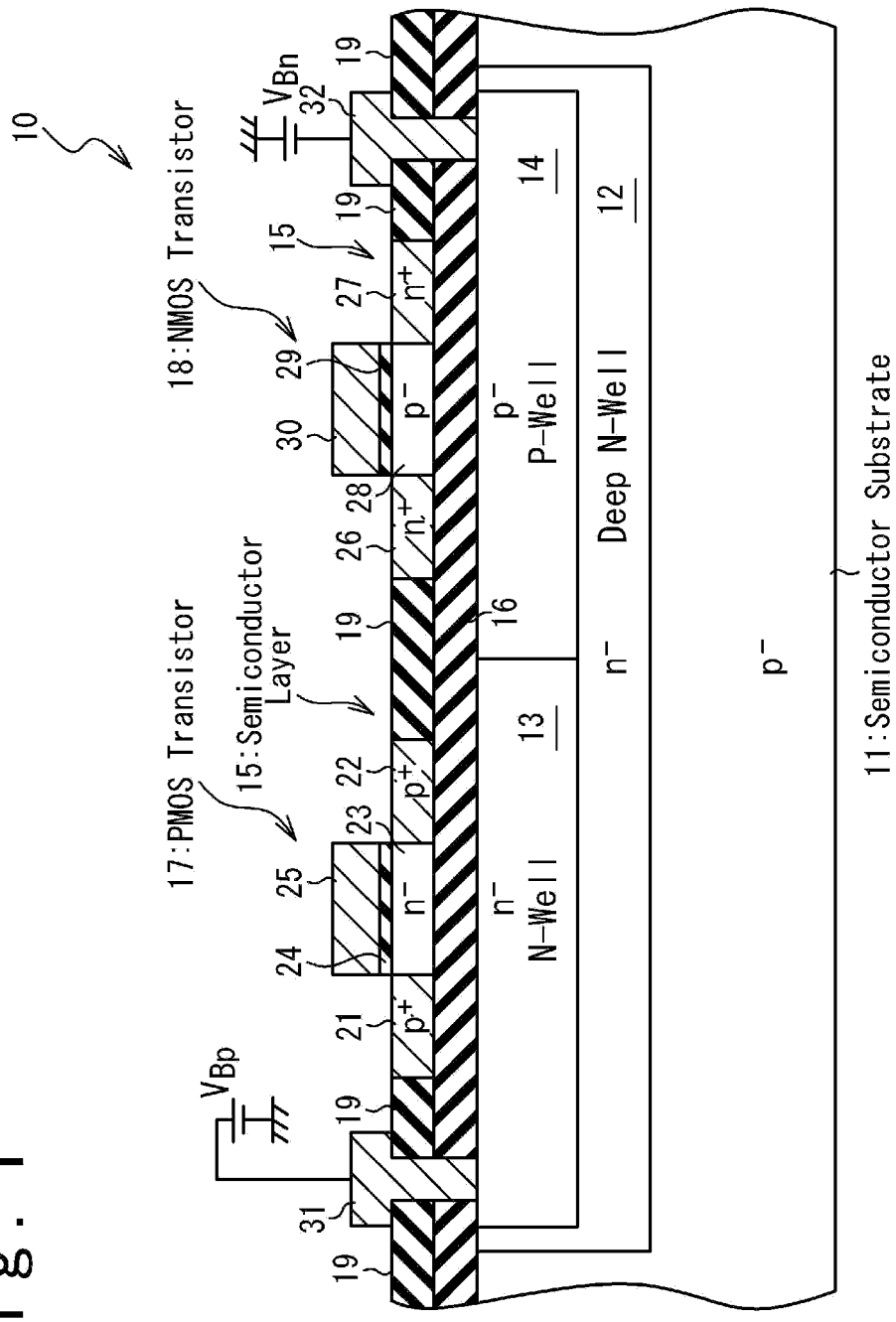
FIG. 1 is a section view illustrating the configuration of a semiconductor device, according to one embodiment.

FIG. 1 is a section view illustrating the configuration of a semiconductor device 10, according to one embodiment of the present invention. The semiconductor device 10 according to this embodiment is configured as an SOI device. More specifically, a deep N-well 12 is formed in a semiconductor substrate 11, and an N-well 13 and a P-well 14 are formed in the deep N-well 12. In this embodiment, a p-type substrate is used as the semiconductor substrate 11. Alternatively, an n-type substrate may be used as the semiconductor substrate 11. The deep N-well 12 and the N-well 13 comprise n-type semiconductor regions doped with n-type impurities, and the P-well 14 comprises a p-type semiconductor region doped with p-type impurities. The N-well 13 and the P-well 14 are adjacent to each other and a pn junction is formed at the boundary between the N-well 13 and the P-well 14.

A semiconductor layer 15 is formed in the surface portion of the semiconductor substrate 11, and a buried oxide film 16 is formed under the semiconductor layer 15. In this embodiment, the semiconductor substrate 11 is formed of silicon, and the semiconductor layer 15 is also formed of silicon. The buried oxide film 16 is formed of silicon dioxide. The buried oxide film 16 electrically isolates the semiconductor layer 15 from the deep N-well 12 (and the N-well 13 and the P-well 14 formed in the deep N-well 12), which is formed under the buried oxide film 16.

Formed in the semiconductor layer 15 are a PMOS transistor 17 and an NMOS transistor 18. Although FIG. 1 only illustrate one PMOS transistor 17 and one NMOS transistor 18, a large number of PMOS transistors 17 and NMOS transistors 18 may be formed in an actual implementation. The PMOS transistor 17 is formed at a position opposing to the N-well 13 across the buried oxide film 16, and the NMOS transistor 18 is formed at a position opposing to the P-well 14 across the buried oxide film 16.

The PMOS transistor 17 comprises $p^+$ regions 21, 22, $n^-$ body region 23, a gate dielectric film 24, and a gate electrode 25. The $p^+$ regions 21 and 22, which are semiconductor regions used as the source and drain of the PMOS transistor 17, are heavily doped with p-type impurities. The $n^-$ body region 23, which is a semiconductor region in which a channel of the PMOS transistor 17 is formed, is doped with n-type impurities. A non-doped semiconductor region may be used as the body region in place of the $n^-$ body region 23. The gate dielectric film 24 is formed on the upper surface of the $n^-$ body region 23, and the gate electrode 25 is formed on the upper surface of the gate dielectric film 24.

The NMOS transistor 18 comprises n+ regions 26, 27, p− body region 28, a gate dielectric film 29, and a gate electrode 30. The n+ regions 26 and 27, which are semiconductor regions used as the source and drain of the NMOS transistor 18, are heavily doped with n-type impurities. The p− body region 28, which is a semiconductor region in which a channel of the NMOS transistor 18 is formed, is doped with p-type impurities. A non-doped semiconductor region may be used as the body region in place of the p− body region 28. The gate dielectric film 29 is formed on the upper surface of the p− body region 28, and the gate electrode 30 is formed on the upper surface of the gate dielectric film 29.

Adjacent MOS transistors (17, 18) are isolated by an isolation dielectric film 19. The isolation dielectric film 19 may be formed, for example, through a shallow trench isolation (STI) technology.

The semiconductor device 10 further comprises tap contacts 31 and 32 which penetrate the buried oxide film 16 and the isolation dielectric film 19. The tap contact 31 is formed to reach the N-well 13 and used to supply a substrate bias voltage $V_{Bp}$ of the PMOS transistor 17 to the N-well 13. The tap contact 32 is formed to reach the P-well 14 and used to supply a substrate bias voltage $V_{Bn}$ of the NMOS transistor 18 to the P-well 14.

Figure 2:
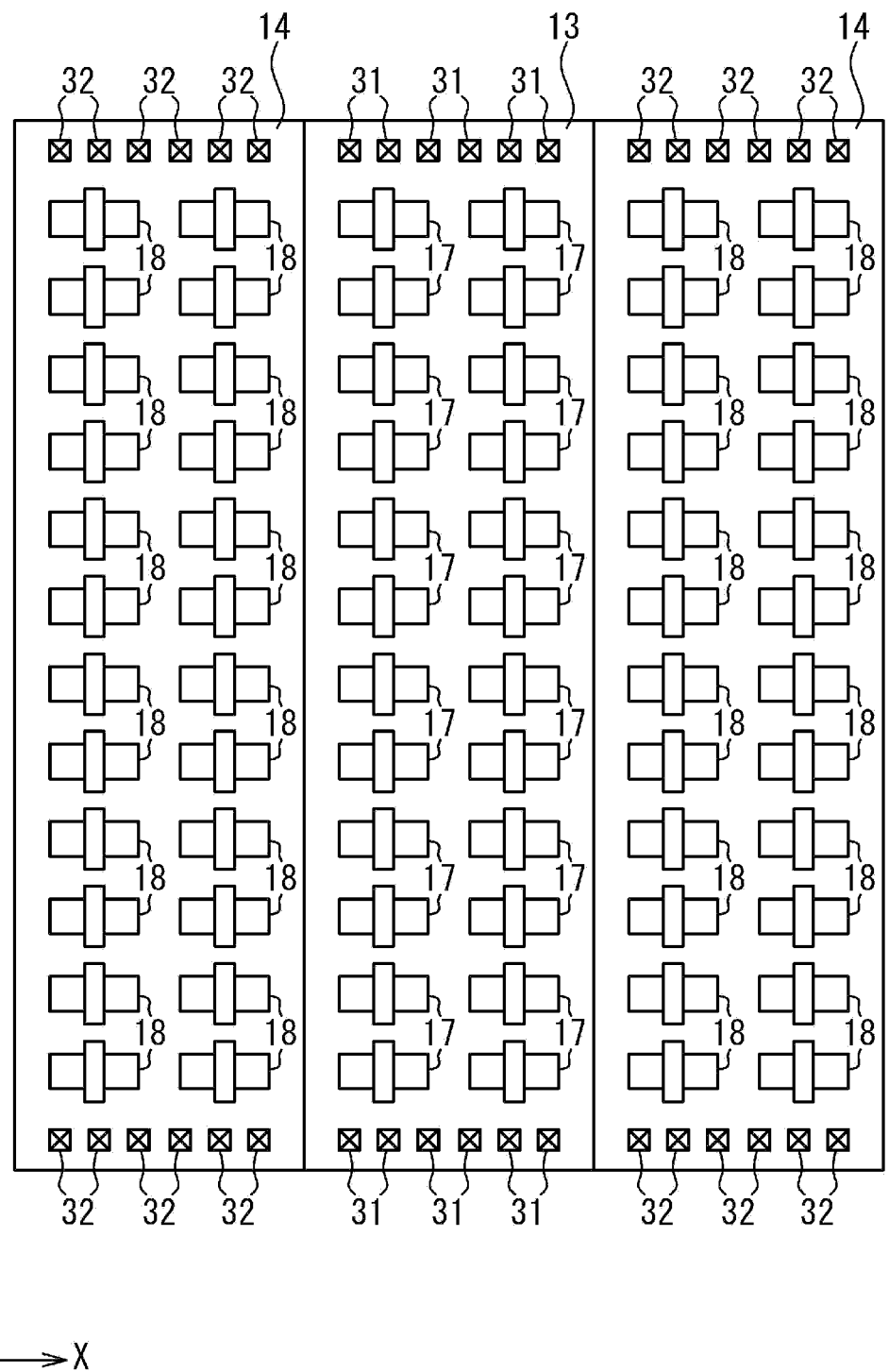
FIG. 2 is a plan view schematically illustrating the layout of the semiconductor device, according to this embodiment.

Although FIG. 1 illustrates that the tap contacts 31 and 32 are formed near the PMOS transistor 17 and the NMOS transistor 18, respectively, the tap contacts 31 and 32 may be located away from the PMOS transistor 17 and the NMOS transistor 18 in an actual implementation. FIG. 2 is a plan view illustrating an example layout of the semiconductor device 10 according to this embodiment. Discussed below is an example illustrated in FIG. 2, in which an N-well 13 and P-wells 14 are formed to extend in a specific direction (in FIG. 2, in the Y axis direction), PMOS transistors 17 and NMOS transistors 18 are arrayed in the Y axis direction, and the tap contacts 31 and 32 are provided at the end portions of the N-well 13 and the P-well 14, respectively. In the layout illustrated in FIG. 2, the PMOS transistors 17 are arrayed in the Y axis direction in two columns over the N-well 13, and the NMOS transistors 18 are arrayed in the Y axis direction in two columns over each P-well 14. In this arrangement, PMOS transistors 17 located near the center of the N-well 13 are distanced away from the tap contacts 31, NMOS transistors 18 located near the centers of the P-wells 14 are distanced away from the tap contacts 32. Although the deep N-well 12 is not illustrated in FIG. 2, the N-well 13 and the P-wells 14 should be understood as being formed in the same deep N-well 12.

The semiconductor device 10 configured as illustrated in FIGS. 1 and 2 achieves improvement in the performances of the PMOS transistors 17 and the NMOS transistors 18 and reduction in the power consumption at the same time, by controlling the threshold voltage $V_{Tp}$ of the PMOS transistors 17 with the substrate bias voltage $V_{Bp}$ and controlling the threshold voltage $V_{Tn}$ of the NMOS transistors 18 with the substrate bias voltage $V_{Bn}$. For example, when it is necessary to operate the semiconductor device 10 at a high speed (for example, when the semiconductor device 10 is operated in a normal operation mode), the substrate bias voltage $V_{Bp}$ of the PMOS transistors 17 are set to 0V or a negative voltage, and the substrate bias voltage $V_{Bn}$ of the NMOS transistors 18 are set to 0V or a positive voltage. This reduces the absolute values of the threshold voltage $V_{Tp}$ of the PMOS transistors 17 and the threshold voltage $V_{Tn}$ of the NMOS transistors 18, achieving high-speed operation of the semiconductor device 10. When the power consumption is to be reduced (for example, when the semiconductor device 10 is operated in a power-reduced mode), the substrate bias voltage $V_{Bp}$ of the PMOS transistors 17 is set to a positive voltage, and the substrate bias voltage $V_{Bn}$ of the NMOS transistors 18 is set to a negative voltage. This increases the absolute values of the threshold voltage $V_{Tp}$ of the PMOS transistors 17 and the threshold voltage $V_{Tn}$ of the NMOS transistors 18, achieving reduction in the power consumption.

The control of the threshold voltages of the PMOS transistors 17 and NMOS transistors 18 with the substrate bias voltages $V_{Bp}$ and $V_{Bn}$ is especially effective for the case when the buried oxide film 16 is thin. In a recent SOI device, the film thickness of the buried oxide film 16 may be in a range from 10 to 25 nm. In such a case, the control of the threshold voltages of the PMOS transistors 17 and NMOS transistors 18 with the substrate bias voltages $V_{Bp}$ and $V_{Bn}$ causes a large effect. It should be noted that the film thickness of the buried oxide film 16 may be further reduced (below 10 nm) in accordance with a recent technological trend of SOI devices.

It is effective for power consumption reduction that the substrate bias voltage $V_{Bp}$ (>0) of the PMOS transistors 17 is raised and the substrate bias voltage $V_{Bn}$ (<0) of the NMOS transistors 18 is lowered, when the semiconductor device 10 is operated in the power-reduced mode; however, the inventors have found that, if the substrate bias voltage $V_{Bp}$ (>0) of the PMOS transistors 17 is excessively raised for reducing the power consumption, this may cause a malfunction of an NMOS transistor 18 when a radiation ray (e.g., a neutron) is made incident on the semiconductor device 10.

Figure 3:
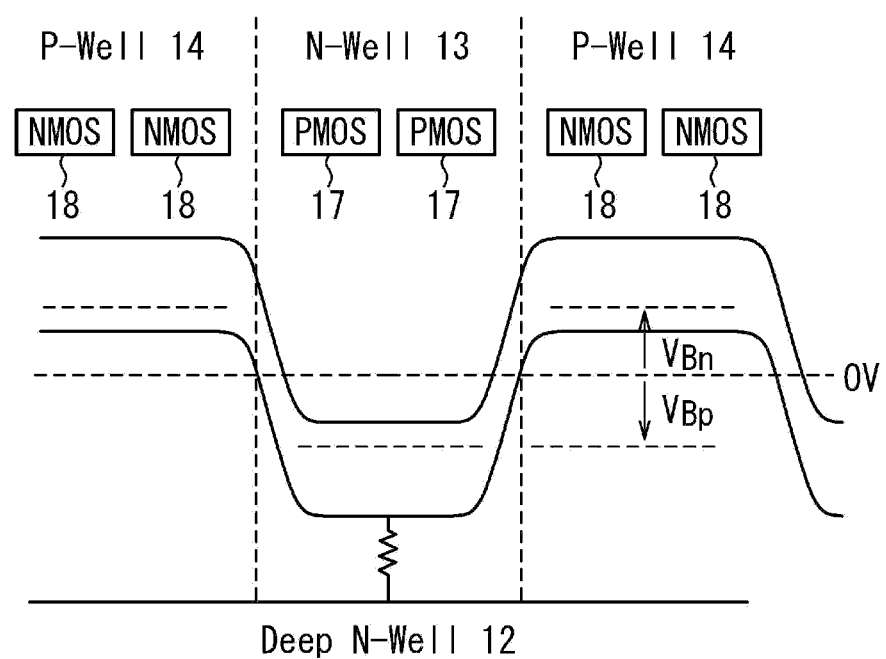
FIG. 3 is an energy band diagram illustrating an energy band structure of a N-well and P-wells for the case when a substrate bias voltage $V_{Bp}$ (>0) is supplied to the N-well and a substrate bias voltage $V_{Bn}$ (<0) is supplied to the P-wells.

FIG. 3 is an energy band diagram illustrating the energy band structure of an N-well 13 and P-wells 14 for the case when a substrate bias voltage $V_{Bp}$ (>0) is supplied to the N-well 13 and a substrate bias voltage $V_{Bn}$ (<0) is supplied to the P-wells 14. The Fermi level of the N-well 13 is lower than the ground level (0V) by $|V_{Bp}|$, and the Fermi level of the P-wells 14 is higher than the ground level (0V) by $|V_{Bn}|$. It should be noted that the potentials of the deep N-well 12 and the N-well 13 are the same, since the deep N-well 12 and the N-well 13 can be considered as being electrically connected through a low resistance, as is understood from the section structure illustrated in FIG. 1.

When a radiation ray is made incident on the N-well 13 or P-well 14 of the semiconductor device 10, electron-hole pairs are generated in the N-well 13 or P-well 14. The PMOS transistors 17 formed over the N-well 13 are less influenced by the generation of the electron-hole pairs. This is because the potential of the N-well 13 is hard to vary even when the generated electrons are collected to the N-well 13. Since the deep N-well 12 and the N-well 13 is electrically connected through a low resistance, the electrons collected to the N-well 13 are drained into the deep N-well 12. Accordingly, even when electrons are collected to the N-well 13, this causes less influence on the operation of the PMOS transistors 17 formed over the N-well 13.

Figure 4:
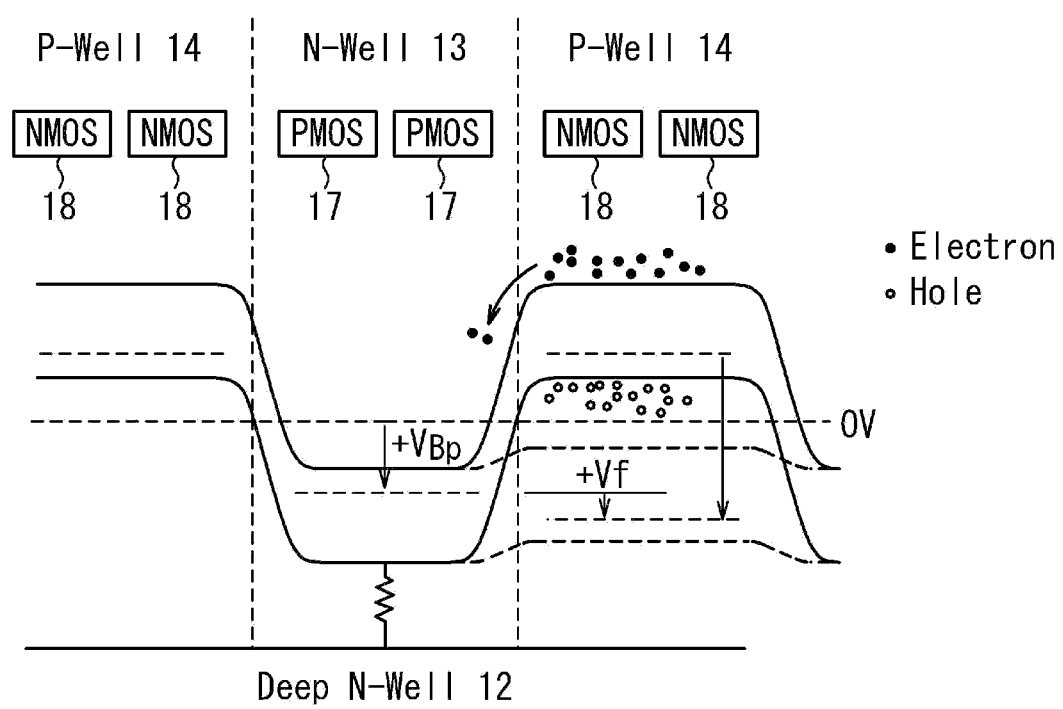
FIG. 4 is an energy band diagram illustrating an energy band structure of the N-well and P-wells for the case when a radiation ray is made incident on a P-well.

As for the P-well 14, as illustrated in FIG. 4, the potential of the P-well 14 increases, and this may cause an influence on the NMOS transistors 18 formed over the P-well 14. It should be noted that electrons and holes behave differently when electron-hold pairs are generated by an incoming radiation ray. The electrons generated by the radiation ray are drained to the deep N-well 12 via the N-well 13, not causing an influence on the potentials of the N-well 13 and the P-well 14. The holes generated by the incoming radiation ray, in contrast, may cause an increase in the potential of the P-well 14. This is because routes through which the holes collected to the P-well 14 can be drained are restricted to the tap contacts 31 connected the P-well 14. The potential of the P-well 14 may increase when holes are collected to the P-well 14. The increase in the potential of the P-well 14 may be significant especially at a position away from the tap contacts 32 of the P-well 14.

As a result of an increase in the potential of the P-well 14, a forward bias Vf may be applied to the pn junction between the N-well 13 and the P-well 14. In FIG. 4, the forward bias is denoted by the legend "+Vf." An assumption that such an event may occur is valid, because it is known by studies of the single event effect that a forward bias may be applied to a pn junction. When the potential of the P-well 14 further increases, an NMOS transistor 18 is undesirably turned on even when the NMOS transistor 18 is originally to be turned off (for example, when the source-gate voltage of the NMOS transistor 18 is set to 0V). This implies the semiconductor device 10 may malfunction.

The inventors have confirmed that a semiconductor device may malfunction through such mechanism by studying soft error rates of static random access memories (SRAMs). The inventors have studied the relations between the error rate and the substrate bias voltages $V_{Bp}$ and $V_{Bn}$ of the PMOS transistors and NMOS transistors with respect to SRAMs in which PMOS and NMOS transistors of the memory cells thereof are formed over N-wells and P-wells extended in a specific direction as illustrated in FIG. 2. When the substrate bias voltages $V_{Bp}$ and $V_{Bn}$ were 0V, single bit upsets (SBU) and small-sized island-like multi bit upsets (MBU) were observed. When the substrate bias voltages $V_{Bp}$ and $V_{Bn}$ were 2V and −2V, respectively, successive bit errors arrayed in the direction in which the N-wells and the P-wells are extended occurred at positions away from tap contacts connected to the N-wells and the P-wells. This result was consistent with the above-described mechanism.

What is the inventors have focused attention on is that the maximum value of the potential of the P-well 14 for the case when a specific substrate bias voltage $V_{Bp}$ is given to the N-well 13 can be considered as being approximately the sum $V_{Bp}+\varphi bi$ of the substrate bias voltage $V_{Bp}$ of a PMOS transistor 17 and the built-in potential $\varphi bi$ of the pn junction between the N-well 13 and the P-well 14. When the potential of the P-well 14 increases up to a positive potential, this results in that a forward bias is applied to the pn junction between the N-well 13 and the P-well 14. In this case, one can consider that the potential of the P-well 14 increases up to the sum of the potential of the N-well 13 and the built-in potential $\varphi bi$ at the highest. It should be noted that, as would be understood to a skilled person, the built-in potential $\varphi bi$ is determined by the material forming the N-well 13 and the P-well 14; the built-in potential $\varphi bi$ is 0.7V when the N-well 13 and the P-well 14 are formed of silicon.

The inventors have found that it is possible to determine the upper limit of the substrate bias voltage $V_{Bp}$ of the PMOS transistors 17 for maintaining the radiation tolerance by making use of this phenomenon. By determining the substrate bias voltage $V_{Bp}$ of the PMOS transistors 17 so as not to turn on the NMOS transistors 18 even when the potential of the P-well 14 increases up to the maximum value $V_{Bp}+\varphi bi$, it is possible to suppress malfunction of the NMOS transistors 18, maintaining the radiation tolerance. In other words, the radiation tolerance can be maintained by determining the lowest substrate bias voltage $V_{Bn(ON)}$ which turns on the NMOS transistors 18 from the drain current-substrate bias voltage characteristic of the NMOS transistors 18 and determining the substrate bias voltage $V_{Bp}$ of the PMOS transistors 17 so that it holds:

$$V_{Bp}+\varphi bi<V_{Bn(ON)}, \quad (1a)$$

that is, $$V_{Bp}<V_{Bn(ON)}-\varphi bi. \quad (1b)$$

Expression (1b) implies that the upper limit of the substrate bias voltage $V_{Bp}$ of the PMOS transistors 17 is $V_{Bn(ON)}-\varphi bi$ for maintaining the radiation tolerance. Accordingly, it is effective to set the substrate bias voltage $V_{Bp}$ of the PMOS transistors 17 to a positive voltage lower than $V_{Bn(ON)}-\varphi bi$ for reducing power consumption of the semiconductor device 10 while maintaining the radiation tolerance thereof.

To reduce the power consumption as much as possible while maintaining the radiation tolerance, it is desirable that the substrate bias voltage $V_{Bp}$ of the PMOS transistors 17 is made closer to $V_{Bn(ON)}-\varphi bi$ as long as the substrate bias voltage $V_{Bp}$ is lower than $V_{Bn(ON)}-\varphi bi$. For example, it is possible to achieve both reduction in the power consumption and maintenance of the radiation tolerance by setting the substrate bias voltage $V_{Bp}$ of the PMOS transistors 17 to the range represented by the following expression (2):

$$0<V_{Bn(ON)}-\varphi bi-V_{CONST1}<V_{Bp}<V_{Bn(ON)}-\varphi bi, \quad (2)$$

where $V_{CONST1}$ is a fixed positive voltage determined in view of the power consumption; the power consumption is effectively reduced as $V_{CONST1}$ decreases.

Since the built-in potential $\varphi bi$ is 0.7V when the N-well 13 and the P-well 14 are formed of silicon (that is, when a silicon substrate is used as the semiconductor substrate 11), expression (3) defining a range of the substrate bias voltage $V_{Bp}$ of the PMOS transistors 17 (in units of volts) for achieving both reduction in the power consumption and maintenance of the radiation tolerance is obtained from expression (2) as follows:

$$V_{Bn(ON)}-0.7-V_{CONST1}<V_{Bp}<V_{Bn(ON)}-0.7. \quad (3)$$

When $V_{CONST1}$ is set to 0.5(V) in view of the power consumption, expression (4a) is obtained from expression (3) as follows:

$$V_{Bn(ON)}-1.2<V_{Bp}<V_{Bn(ON)}-0.7. \quad (4a)$$

When $V_{CONST1}$ is set to 0.3(V) in view of the power consumption, expression (4b) is obtained from expression (3) as follows:

$$V_{Bn(ON)}-1.0<V_{Bp}<V_{Bn(ON)}-0.7. \quad (4b)$$

Furthermore, when $V_{CONST1}$ is set to 0.2(V) in view of the power consumption, expression (4c) is obtained from expression (3) as follows:

$$V_{Bn(ON)}-0.9<V_{Bp}<V_{Bn(ON)}-0.7. \quad (4c)$$

As is understood from the above-described discussion, when a silicon substrate is used as the semiconductor substrate 11, it is possible to achieve both reduction in the power consumption and maintenance of the radiation tolerance by setting the substrate bias voltage $V_{Bp}$ of the PMOS transistors 17 to satisfy expression (4a), more preferably, expression (4b), further preferably expression (4c).

In an actual design and operation of the semiconductor device 10, the lowest substrate bias voltage $V_{Bn(ON)}$ which turns on the NMOS transistors 18 may be unknown. In such a case, a procedure of an operation adjustment method described below allows determining the substrate bias voltage $V_{Bn(ON)}$ and further determine the substrate bias voltage $V_{Bp}$ of the PMOS transistors 17 for achieving both reduction in the power consumption and maintenance of the radiation tolerance.

Figure 5:
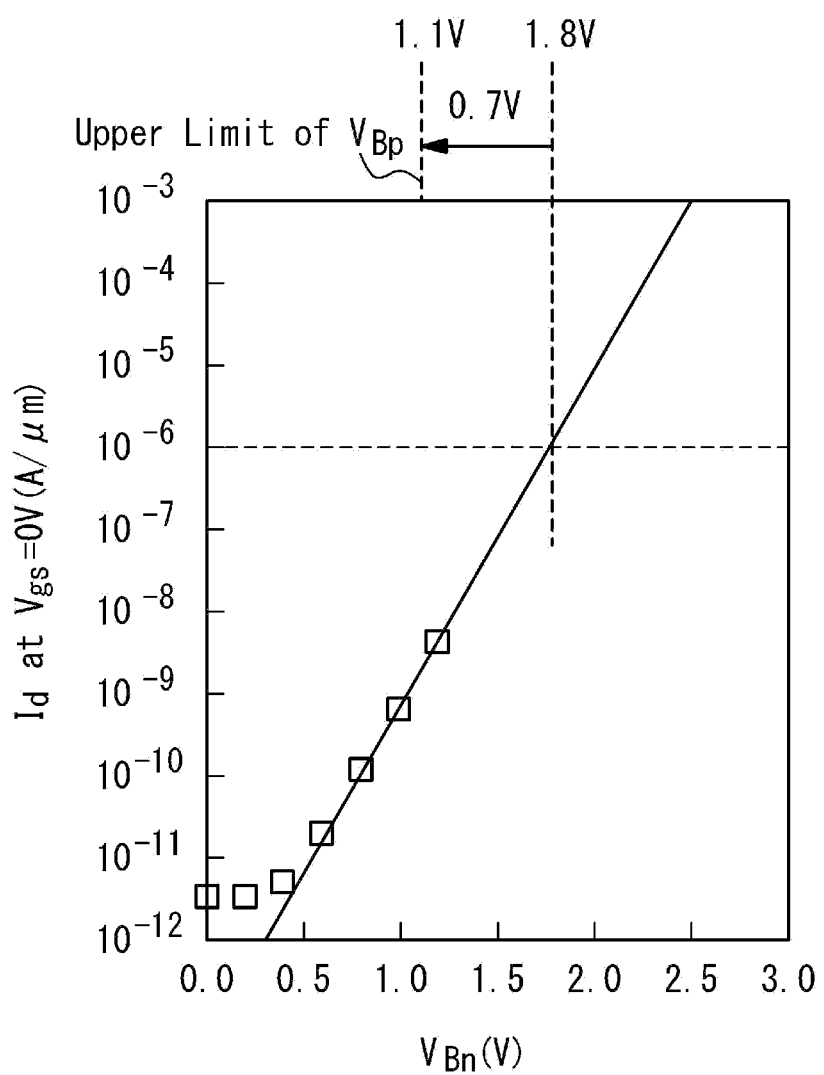
FIG. 5 is a graph illustrating one example drain current-substrate bias voltage characteristic of an NMOS transistor.
Figure 6:
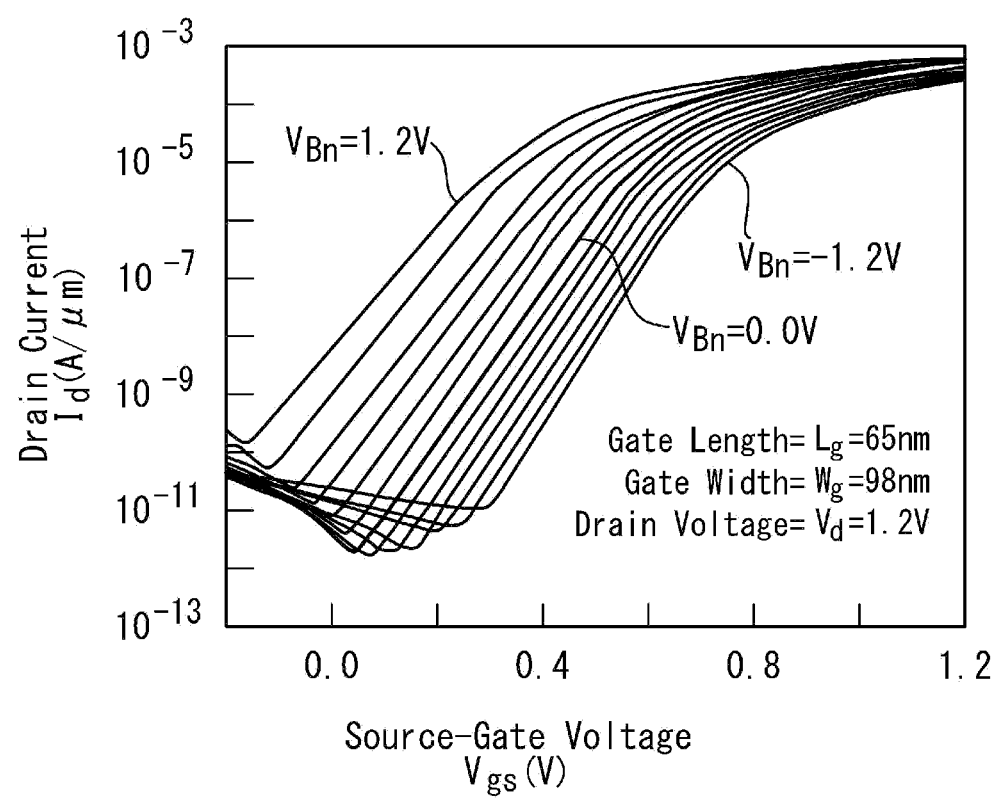
FIG. 6 is a graph illustrating one example drain current-gate voltage characteristic of an NMOS transistor.

Step S01:
First, the drain current-substrate bias voltage characteristic of the NMOS transistors 18 is obtained for the case when the source-gate voltage Vgs is 0V. FIG. 5 illustrates one example of the drain current-substrate bias voltage characteristic thus obtained. The drain current-substrate bias voltage characteristic may be obtained through an arbitrary method. For example, the drain current-substrate bias voltage characteristic may be obtained from the drain current-gate voltage characteristic of the NMOS transistors 18. FIG. 6 illustrates one example of the drain current-gate voltage characteristic available for obtaining the drain current-substrate bias voltage characteristic. Illustrated in FIG. 6 is the drain current-gate voltage characteristic of the NMOS transistors 18 obtained when the substrate bias voltage $V_{Bn}$ of the NMOS transistors 18 are varied from −1.2V to 1.2V in steps of 0.2V. For the drain current-gate voltage characteristic illustrated in FIG. 6, identifying the drain currents Id for the respective values of the substrate bias voltage $V_{Bn}$ with respect to the source-gate voltage Vgs of 0V makes it possible to obtain the drain current-substrate bias voltage characteristic of the NMOS transistors 18 based on the identified values.

Step S02:

The lowest substrate bias voltage $V_{Bn(ON)}$ which turns on the NMOS transistors 18 is determined based on the drain current-substrate bias voltage characteristic obtained in step S01. In general, an NMOS transistor 18 is determined as being placed into the on-state when the drain current Id of the NMOS transistor 18 is increased up to $1 \times 10^{-6}$ A/μm. Accordingly, the substrate bias voltage $V_{Bn}$ for the case when the drain current Id of the NMOS transistor 18 is $1 \times 10^{-6}$ A/μm is determined as the substrate bias voltage $V_{Bn(ON)}$ in this embodiment. The substrate bias voltage $V_{Bn(ON)}$ may be determined through extrapolation, when the range of the substrate bias voltage defined for the drain current-substrate bias voltage characteristic obtained in step S02 does not include the lowest substrate bias voltage $V_{Bn(ON)}$ which turns on the NMOS transistors 18. Note that the substrate bias voltage $V_{Bn(ON)}$ is obtained with respect to the case when the source-gate voltage Vgs is 0V (that is, the case when the NMOS transistors 18 are originally to be turned off).

Step S03:

The upper limit of the substrate bias voltage $V_{Bp}$ of the PMOS transistors 17 to maintain the radiation tolerance is determined based on the lowest substrate bias voltage $V_{Bn(ON)}$ which turns on the NMOS transistors 18, which is determined in step S02. As described above, the upper limit of the substrate bias voltage $V_{Bp}$ of the PMOS transistors 17 is $V_{Bn(ON)}$−φbi, more specifically, $V_{Bn(ON)}$−0.7 (V) when the semiconductor substrate 11 is a silicon substrate.

Step S04:

The substrate bias voltage $V_{Bp}$ of the PMOS transistors 17 is determined based on the upper limit of the substrate bias voltage $V_{Bp}$ of the PMOS transistors 17, which is determined in step S03, and a requested specification of power consumption. It is possible to reduce the power consumption of the semiconductor device 10 and provide the radiation tolerance by setting the substrate bias voltage $V_{Bp}$ of the PMOS transistors 17 to a positive voltage lower than $V_{Bn(ON)}$−φbi. When a silicon substrate is used as the semiconductor substrate 11, it is possible to further reduce the power consumption of the semiconductor device 10 by setting the substrate bias voltage $V_{Bp}$ of the PMOS transistors 17 so that one of the conditions defined by expressions (4a) to (4c) is satisfied.

Figure 7:
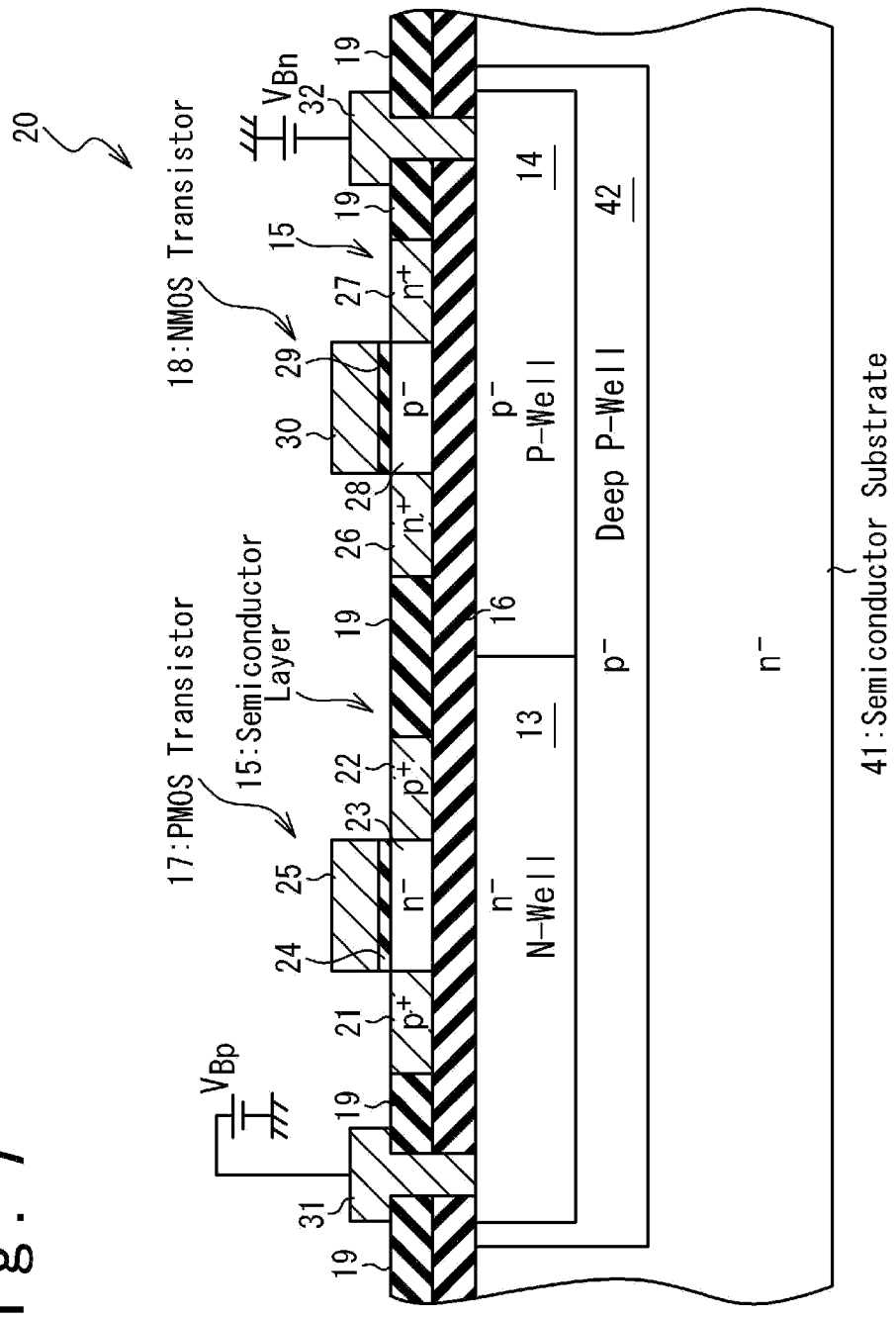
FIG. 7 is a section view illustrating the configuration of an example variation of the semiconductor device, according to this embodiment.

A discussion similar to the above-described discussion applies to a semiconductor device 20 illustrated in FIG. 7, in which a deep P-well 42 is formed in a semiconductor substrate 41. Note that the deep P-well 42 comprises a p-type semiconductor region doped with p-type impurities. Illustrated in FIG. 7 is a structure in which an n-type substrate is used as the semiconductor substrate 41. Alternatively, a p-type substrate may be used as the semiconductor substrate 41.

With respect to the structure illustrated in FIG. 7, the issue is malfunction of the PMOS transistors 17 for the case when electrons generated by an incoming radiation ray are collected to the N-well 13. As would be understood by referring to the discussion given to FIGS. 3 and 4, the structure of the semiconductor device 20 illustrated in FIG. 7 may suffer from a decrease in the potential of the N-well 13 when the electrons generated by the incoming radiation ray are collected to the N-well 13. This is because routes through which the electrons are drained from the N-well 13 are restricted to the tap contacts 31. When the potential of the N-well 13 is lowered, a PMOS transistors 17 is undesirably turned on even when the PMOS transistor 17 is originally to be turned off (for example, when the source-gate voltage of the PMOS transistor 17 is set to 0V). This implies that the semiconductor device 20 may malfunction.

Since a forward bias is applied to the pn junction between the N-well 13 and the P-well 14 when the potential of the N-well 13 is lowered, the potential of the N-well 13 can be reduced only down to the potential which is lower than the potential of the P-well 14 by the built-in potential φbi at the lowest.

By making use of this phenomenon, it is possible to determine the lower limit of the substrate bias voltage $V_{Bn}$ of the NMOS transistors 18 to maintain radiation tolerance. It is possible to maintain the radiation tolerance by determining the substrate bias voltage $V_{Bn}$ of the NMOS transistors 18 so as not to turn on the PMOS transistors 17 even when the potential of the N-well 13 decreases down to the lowest value $V_{Bn}$−φbi. In other words, it is possible to maintain the radiation tolerance by determining the highest substrate bias voltage $V_{Bp(ON)}$ which turns on the PMOS transistors 17 from the drain current-substrate bias voltage characteristic of the PMOS transistors 17 (note that the substrate bias voltage $V_{Bp(ON)}$ is a negative voltage) and determining the substrate bias voltage $V_{Bn}$ of the NMOS transistors 18 so that it holds:

$$V_{Bp(ON)} < V_{Bn} - \varphi bi, \quad (5a)$$

that is, $$V_{Bn} > V_{Bp(ON)} + \varphi bi. \quad (5b)$$

Expression (5b) implies that the lower limit of the substrate bias voltage $V_{Bn}$ of the NMOS transistors 18 to maintain the radiation tolerance is $V_{Bp(ON)}$+φbi. Accordingly, it is effective for reducing the power consumption of the semiconductor device 20 and maintaining the radiation tolerance to set the substrate bias voltage $V_{Bn}$ of the NMOS transistors 18 to a negative voltage higher than $V_{Bp(ON)}$+φbi.

To reduce the power consumption as much as possible while maintaining the radiation tolerance, it is desirable that the substrate bias voltage $V_{Bn}$ of the NMOS transistors 18 is made closer to $V_{Bp(ON)}$+φbi as long as the substrate bias voltage $V_{Bn}$ is higher than $V_{Bp(ON)}$+φbi. For example, it is possible to achieve both reduction in the power consumption and maintenance of the radiation tolerance by setting the substrate bias voltage $V_{Bn}$ of the NMOS transistors 18 to the range represented by the following expression (6):

$$V_{Bp(ON)} + \varphi bi < V_{Bn} < V_{Bp(ON)} + \varphi bi + V_{CONST2} < 0, \quad (6)$$

where $V_{CONST2}$ is a fixed positive voltage determined in view of the power consumption; the power consumption is effectively reduced as $V_{CONST2}$ decreases.

Since the built-in potential φbi is 0.7V when the N-well 13 and the P-well 14 are formed of silicon (that is, when a silicon substrate is used as the semiconductor substrate 41), expression (7) defining a range of the substrate bias voltage $V_{Bn}$ of the NMOS transistors 18 (in units of volts) for achieving both reduction in the power consumption and maintenance of the radiation tolerance is obtained from expression (6) as follows:

$$V_{Bp(ON)} + 0.7 < V_{Bn} < V_{Bp(ON)} + 0.7 + V_{CONST2}. \quad (7)$$

When $V_{CONST2}$ is set to 0.5 (V) in view of the power consumption, expression (8a) is obtained from expression (7) as follows:

$$V_{Bp(ON)} + 0.7 < V_{Bn} < V_{Bp(ON)} + 1.2. \quad (8a)$$

When $V_{CONST2}$ is set to 0.3(V) in view of the power consumption, expression (8b) is obtained from expression (7) as follows:

$$V_{Bp(ON)} + 0.7 < V_{Bn} < V_{Bp(ON)} + 1.0. \quad (8b)$$

Furthermore, when $V_{CONST2}$ is set to 0.2(V) in view of the power consumption, expression (8c) is obtained from expression (7) as follows:

$$V_{Bp(ON)} + 0.7 < V_{Bn} < V_{Bp(ON)} + 0.9. \quad (8c)$$

With respect to the semiconductor device 20 configured as illustrated in FIG. 7, when a silicon substrate is used as the semiconductor substrate 41, it is possible to achieve both reduction in the power consumption and maintenance of the radiation tolerance, by setting the substrate bias voltage $V_{Bn}$ of the NMOS transistors 18 to satisfy expression (8a), more preferably, expression (8b), further preferably expression (8c).

Also with respect to the semiconductor device 20 illustrated in FIG. 7, it is possible to determine the substrate bias voltage $V_{Bn}$ of the NMOS transistors 18 for achieving both reduction in the power consumption and maintenance of the radiation tolerance through a similar way to the above-described operation setting method for the semiconductor device 10. More specifically, the substrate bias voltage $V_{Bn}$ of the NMOS transistors 18 is determined through the following procedure. First, the drain current-substrate bias characteristic of the PMOS transistors 17 is obtained for the case when the source-gate voltage Vgs is 0V (step S01). The highest substrate bias voltage $V_{Bp(ON)}$ which turns on the PMOS transistors 17 is determined based on the obtained drain current-substrate bias voltage characteristic (step S02). The lower limit of the substrate bias voltage $V_{Bn}$ of the NMOS transistors 18 to maintain the radiation tolerance is determined based on the highest substrate bias voltage $V_{Bp(ON)}$ thus determined, which turns on the PMOS transistors 17. As described above, the lower limit of the substrate bias voltage $V_{Bn}$ of the NMOS transistors 18 is $V_{Bp(ON)} + $φbi, more specifically, $V_{Bp(ON)} + 0.7$ (V) when the semiconductor substrate 11 is a silicon substrate. Furthermore, the substrate bias voltage $V_{Bn}$ of the NMOS transistors 18 is determined based the lower limit of the substrate bias voltage $V_{Bn}$ of the NMOS transistors 18 thus determined and a requested specification of power consumption (step S04).

Figure 8:
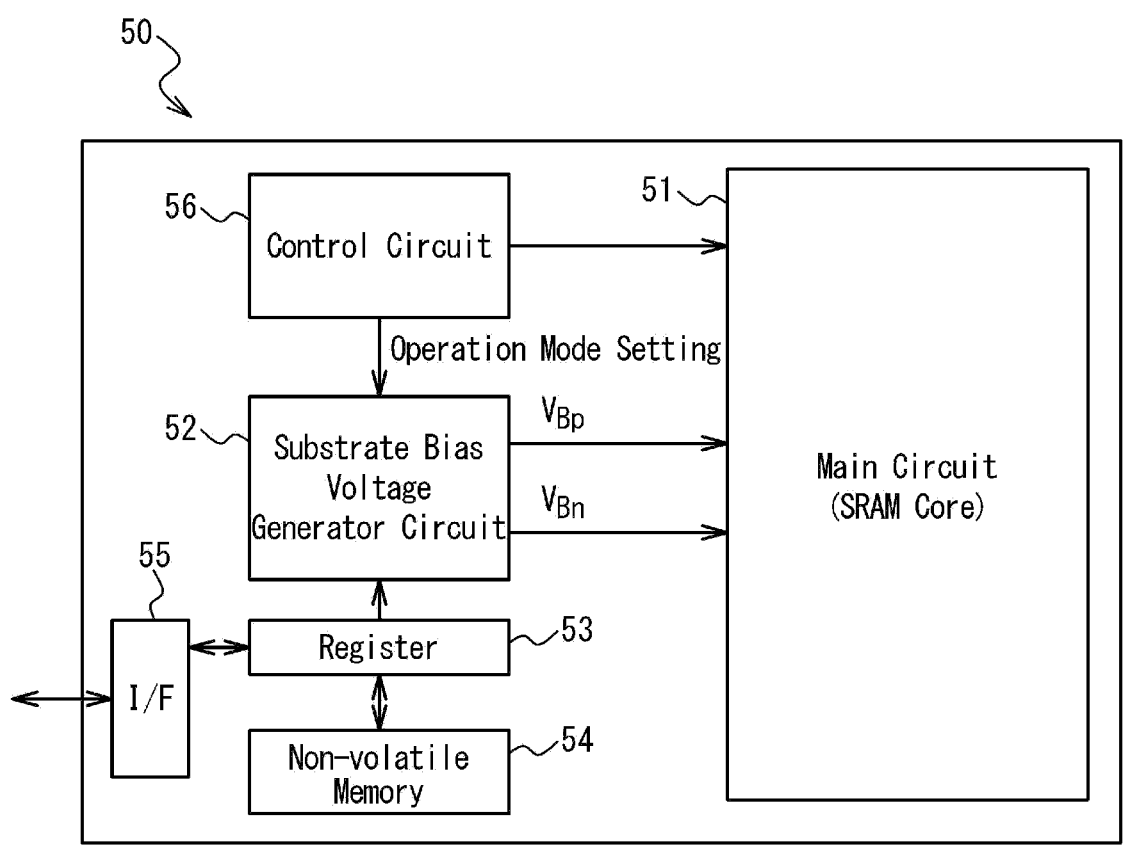
FIG. 8 is a block diagram illustrating one example configuration of an integrated circuit device using the configuration of the semiconductor device according to this embodiment.

The configuration and operation adjustment method of the semiconductor devices 10 and 20 according to this embodiment are suitable especially for integrated circuit devices configured to adjust a substrate bias voltage. FIG. 8 is a block diagram schematically illustrating an integrated circuit device 50 thus configured.

The integrated circuit device 50 illustrated in FIG. 8 has at least two operation modes: a normal operation mode (first mode) and a power consumption reduction mode (second mode). In the power consumption reduction mode, the power consumption is reduced by controlling the substrate bias voltage $V_{Bp}$ of the PMOS transistors 17 and the substrate bias voltage $V_{Bn}$ of the NMOS transistors 18.

The integrated circuit device 50 comprises a main circuit 51, a substrate bias voltage generator circuit 52, a register 53, a non-volatile memory 54, an interface 55, and a control circuit 56.

The main circuit 51 comprises a group of circuits for achieving functions desired by users. For example, an SRAM core may be used as the main circuit 51. When the semiconductor substrate in which the integrated circuit device 50 is integrated is a p-type substrate, the semiconductor device 10 illustrated in FIG. 1 is integrated in the main circuit 51. When the semiconductor substrate in which the integrated circuit device 50 is integrated is an n-type substrate, the semiconductor device 20 illustrated in FIG. 7 is integrated in the main circuit 51.

The substrate bias voltage generator circuit 52 supplies the substrate bias voltage $V_{Bp}$ of the PMOS transistors 17 and the substrate bias voltage $V_{Bn}$ of the NMOS transistors 18 to the main circuit 51. The substrate bias voltage $V_{Bp}$ of the PMOS transistor 17 is supplied to the N-well 13 of the main circuit 51, and the substrate bias voltage $V_{Bn}$ of the NMOS transistor 18 is supplied to the P-well 14 of the main circuit 51.

The register 53 holds register values for controlling the operation of the integrated circuit device 50. The register values held by the register 53 include register values listed below:

(a) a register value specifying the substrate bias voltage $V_{Bp}$ of the PMOS transistors 17 in the normal operation mode;

(b) a register value specifying the substrate bias voltage $V_{Bn}$ of the NMOS transistors 18 in the normal operation mode;

(c) a register value specifying the substrate bias voltage $V_{Bp}$ of the PMOS transistors 17 in the power consumption reduction mode; and (d) a register value specifying the substrate bias voltage $V_{Bn}$ of the NMOS transistors 18 in the power consumption reduction mode.

The register 53 is accessible from an external device via the interface 55; it is possible to adjust the substrate bias voltage $V_{Bp}$ of the PMOS transistors 17 and the substrate bias voltage $V_{Bn}$ of the NMOS transistors 18 by rewriting the register values.

The non-volatile memory 54 holds register values to be set to the register 53 upon boot of the integrated circuit device 50 in a non-volatile manner. This results in that the above-described register values (a) to (d) are set to the register values stored in the non-volatile memory 54 immediately after the boot of the integrated circuit device 50. The non-volatile memory 54 is accessible from the external device via the interface 55; it is possible to set register values to be set to the register 53 upon boot of the integrated circuit device 50 by writing the register values into the non-volatile memory 54. This implies that the above-described register values (a) to (d) to be set to the register 53 upon the boot of the integrated circuit device 50, in other words, the substrate bias voltage $V_{Bp}$ and $V_{Bn}$ of the PMOS transistors 17 and the NMOS transistors 18 in the normal operation mode and those in the power consumption mode are settable from the external device.

The interface 55 is used for data communications with the external device. The interface 55 has the function of externally receiving the register values to be set to the register 53 and rewriting the register values of the register 53 to the externally-received register values. The interface 55 also has the function of externally receiving the register values to be set to the non-volatile memory 54 and rewriting the register values of the non-volatile memory 54 to the externally-received register values.

The control circuit 56 controls the operations of various circuits incorporated in the integrated circuit device 50. The control circuit 56 supplies control signals to the main circuit 51 and the substrate bias voltage generator circuit 52 to control the operations of the main circuit 51 and the substrate bias voltage generator circuit 52. The control signals supplied to the substrate bias voltage generator circuit 52 comprise an operation mode setting signal indicating the operation mode of the integrated circuit device 50, and the substrate bias voltage generator circuit 52 sets the substrate bias voltage $V_{Bp}$ of the PMOS transistors 17 and the substrate bias voltage $V_{Bn}$ of the NMOS transistors 18 in response to the operation mode setting signal.

The integrated circuit device 50 thus configured operates as follows.

When the integrated circuit device 50 is booted, the register values stored in the non-volatile memory 54 are written into the register 53. This achieves setting of the substrate bias voltage $V_{Bp}$ of the PMOS transistors 17 and the substrate bias voltage $V_{Bn}$ of the NMOS transistors 18 in each of the normal operation mode and the power consumption reduction mode.

The substrate bias voltage generator circuit 52 generates the substrate bias voltage $V_{Bp}$ of the PMOS transistors 17 and the substrate bias voltage $V_{Bn}$ of the NMOS transistors 18 in response to the operation mode specified by the operation mode setting signal received from the control circuit 56 and supplies the generated substrate bias voltages $V_{Bp}$ and $V_{Bn}$ to the N-well 13 and the P-well 14 of the main circuit 51. The substrate bias voltage $V_{Bp}$ of the PMOS transistors 17 for the power consumption reduction mode is a positive voltage higher than the substrate bias voltage $V_{Bp}$ for the normal operation mode. The substrate bias voltage $V_{Bn}$ of the NMOS transistors 18 for the power consumption reduction mode is a negative voltage lower than the substrate bias voltage $V_{Bn}$ for the normal operation mode.

When the integrated circuit device 50 uses the configuration of the semiconductor device 10 illustrated in FIG. 1 (that is, when the configuration in which the deep N-well 12 is formed in the p-type semiconductor substrate 11 is used), the substrate bias voltage $V_{Bp}$ of the PMOS transistors 17 for the power consumption reduction mode is set to a positive voltage lower than $V_{Bn(ON)}-\varphi bi$. The substrate bias voltage $V_{Bp}$ of the PMOS transistors 17 for the power consumption reduction mode is preferably set so that expression (4a) is satisfied, more preferably so that expression (4b) is satisfied, and further preferably so that expression (4c) is satisfied.

When the integrated circuit device 50 uses the configuration of the semiconductor device 20 illustrated in FIG. 7 (that is, when the configuration in which the deep P-well 42 is formed in the n-type semiconductor substrate 41 is used), the substrate bias voltage $V_{Bn}$ of the NMOS transistors 18 for the power consumption reduction mode is set to a negative voltage higher than $V_{Bp(ON)}+\varphi bi$. The substrate bias voltage $V_{Bn}$ of the NMOS transistors 18 for the power consumption reduction mode is preferably set so that expression (8a) is satisfied, more preferably so that expression (8b) is satisfied, and further preferably so that expression (8c) is satisfied.

The above-described operation achieves both reduction in the power consumption and maintenance of the radiation tolerance for the integrated circuit device 50.

Although embodiments of the present invention have been specifically described, the present invention is not limited to the above-described embodiments. It would be understood by a person skilled in the art that the present invention may be implemented with various modifications.

This application is based on Japanese patent application No. 2017-046514, filed on Mar. 10, 2017 and claims the benefit of priority thereof. The disclosure of the same is incorporated herein by reference.

The invention claimed is:

1. An operation adjustment method for a semiconductor device comprising: a semiconductor substrate; a deep N-well formed in the semiconductor substrate; an N-well formed in the deep N-well; a P-well formed in the deep N-well; a semiconductor layer formed in a surface portion of the semiconductor substrate; and a buried dielectric layer formed between the semiconductor layer and the deep N-well to electrically isolate the semiconductor layer and the deep N-well, a pn junction being formed between the N-well and the P-well, a PMOS transistor being formed in the semiconductor layer at a position opposing to the N-well, an NMOS transistor being formed in the semiconductor layer at a position opposing to the P-well, and the method comprising steps of:
   (a) obtaining a drain current-substrate bias voltage characteristic of the NMOS transistor for a source-gate voltage of 0V;
   (b) obtaining a lowest substrate bias voltage which turns on the NMOS transistor from the drain current-substrate bias voltage characteristic;
   (c) determining an upper limit of a substrate bias voltage of the PMOS transistor as a voltage obtained by subtracting a built-in potential of the pn junction from the lowest substrate bias voltage; and
   (d) determining the substrate bias voltage of the PMOS transistor as a positive voltage lower than the upper limit.

2. The operation adjustment method according to claim 1, wherein the semiconductor substrate comprises a silicon substrate, and
   wherein, in the (d) step, the substrate bias voltage of the PMOS transistor is determined as being higher than a voltage obtained by subtracting 1.2V from the lowest substrate bias voltage and lower than a voltage obtained by subtracting 0.7V from the lowest substrate bias voltage.

3. The operation adjustment method according to claim 1, wherein the semiconductor substrate comprises a silicon substrate, and
   wherein, in the (d) step, the substrate bias voltage of the PMOS transistor is determined as being higher than a voltage obtained by subtracting 1.0V from the lowest substrate bias voltage and lower than a voltage obtained by subtracting 0.7V from the lowest substrate bias voltage.

4. The operation adjustment method according to claim 1, wherein the (a) step comprises:
   obtaining drain current-gate voltage characteristics of the NMOS transistor for a plurality of substrate bias voltages; and
   obtaining the drain current-substrate bias voltage characteristic by identifying a drain current of the NMOS transistor for a case when a source-gate voltage is 0V for each of the plurality of substrate bias voltages.

5. An operation adjustment method for a semiconductor device comprising: a semiconductor substrate; a deep P-well formed in the semiconductor substrate; an N-well formed in the deep P-well; a P-well formed in the deep P-well; a semiconductor layer formed in a surface portion of the semiconductor substrate; and a buried dielectric layer formed between the semiconductor layer and the deep P-well to electrically isolate the semiconductor layer and the deep P-well, a pn junction being formed between the N-well and the P-well, a PMOS transistor being formed in the semiconductor layer at a position opposing to the N-well, an NMOS transistor being formed in the semiconductor layer at a position opposing to the P-well, the method comprising:
  (a) obtaining a drain current-substrate bias voltage characteristic of the PMOS transistor for a source-gate voltage of 0V;
  (b) obtaining a highest substrate bias voltage which turns on the PMOS transistor from the drain current-substrate bias voltage characteristic;
  (c) determining a lower limit of a substrate bias voltage of the NMOS transistor as a voltage obtained by adding a built-in potential of the pn junction to the highest substrate bias voltage; and
  (d) determining the substrate bias voltage of the NMOS transistor as a negative voltage higher than the lower limit.

6. The operation adjustment method according to claim 5, wherein the semiconductor substrate comprises a silicon substrate, and
  wherein, in the (d) step, the substrate bias voltage of the NMOS transistor is determined as being higher than a voltage obtained by adding 0.7V to the highest substrate bias voltage and lower than a voltage obtained by adding 1.2V to the highest substrate bias voltage.

7. The operation adjustment method according to claim 5, wherein the semiconductor substrate comprises a silicon substrate, and
  wherein, in the (d) step, the substrate bias voltage of the NMOS transistor is determined as being higher than a voltage obtained by adding 0.7V to the highest substrate bias voltage and lower than a voltage obtained by adding 1.0V to the highest substrate bias voltage.

8. A semiconductor device, comprising:
a main circuit comprising a PMOS transistor and an NMOS transistor;
a substrate bias voltage generator circuit configured to generate a substrate bias voltage of the PMOS transistor; and
a control circuit configured to control the substrate bias voltage of the PMOS transistor,
wherein the main circuit comprises:
a deep N-well formed in a semiconductor substrate;
an N-well formed in the deep N-well;
a P-well formed in the deep N-well;
a semiconductor layer formed in a surface portion of the semiconductor substrate; and
a buried dielectric layer formed between the semiconductor layer and the deep N-well to electrically isolate the semiconductor layer from the deep N-well,
wherein a pn junction is formed between the N-well and the P-well,
wherein the PMOS transistor is formed in the semiconductor layer at a position opposing to the N-well,
wherein the NMOS transistor is formed in the semiconductor layer at a position opposing to the P-well,
wherein the control circuit is configured to set a substrate bias voltage of the PMOS transistor to a first voltage when the semiconductor device is placed in a first mode,
wherein the control circuit is configured to set the substrate bias voltage of the PMOS transistor to a second voltage higher than the first voltage when the semiconductor device is placed in a second mode, and
wherein the second voltage is a positive voltage lower than a voltage obtained by subtracting a built-in potential of the pn junction from a lowest substrate bias voltage which turns on the NMOS transistor when a source-gate voltage thereof is 0V.

9. The semiconductor device according to claim 8, wherein the semiconductor substrate comprises a silicon substrate, and
  wherein the second voltage is higher than a voltage obtained by subtracting 1.2V from the lowest substrate bias voltage and lower than a voltage obtained by subtracting 0.7V from the lowest substrate bias voltage.

10. The semiconductor device according to claim 8, wherein the semiconductor substrate comprises a silicon substrate, and
  wherein the second voltage is higher than a voltage obtained by subtracting 1.0V from the lowest substrate bias voltage and lower than a voltage obtained by subtracting 0.7V from the lowest substrate bias voltage.

11. A semiconductor device, comprising:
a main circuit comprising a PMOS transistor and an NMOS transistor;
a substrate bias voltage generator circuit configured to generate a substrate bias voltage of the NMOS transistor; and
a control circuit configured to control the substrate bias voltage of the NMOS transistor,
wherein the main circuit comprises:
a deep P-well formed in a semiconductor substrate;
an N-well formed in the deep P-well;
a P-well formed in the deep P-well;
a semiconductor layer formed in a surface portion of the semiconductor substrate; and
a buried dielectric layer formed between the semiconductor layer and the deep P-well to electrically isolate the semiconductor layer from the deep P-well,
wherein a pn junction is formed between the N-well and the P-well,
wherein the PMOS transistor is formed in the semiconductor layer at a position opposing to the N-well,
wherein the NMOS transistor is formed in the semiconductor layer at a position opposing to the P-well,
wherein the control circuit is configured to set a substrate bias voltage of the NMOS transistor to a first voltage when the semiconductor device is placed in a first mode,
wherein the control circuit is configured to set the substrate bias voltage of the NMOS transistor to a second voltage lower than the first voltage when the semiconductor device is placed in a second mode, and
wherein the second voltage is a negative voltage higher than a voltage obtained by adding a built-in potential of the pn junction to a highest substrate bias voltage which turns on the PMOS transistor when a source-gate voltage thereof is 0V.

12. The semiconductor device according to claim 11, wherein the semiconductor substrate comprises a silicon substrate, and
  wherein the second voltage is higher than a voltage obtained by adding 0.7V to the highest substrate bias voltage and lower than a voltage obtained by adding 1.2V to the highest substrate bias voltage.

13. The semiconductor device according to claim 11, wherein the semiconductor substrate comprises a silicon substrate, and
wherein the second voltage is higher than a voltage obtained by adding 0.7V to the highest substrate bias voltage and lower than a voltage obtained by adding 1.0V to the highest substrate bias voltage.

* * * * *